(12) United States Patent
Park et al.

(10) Patent No.: US 10,502,766 B2
(45) Date of Patent: Dec. 10, 2019

(54) MEASUREMENT METHOD AND APPARATUS FOR SIMULTANEOUS CORRECTION OF DISTURBANCE AND OFFSET OF SENSOR

(71) Applicant: Korea Electronics Technology Institute, Seongnam-si, Gyeonggi-do (KR)

(72) Inventors: Won Ki Park, Suwon-si (KR); Dae Sung Lee, Yongin-si (KR); Dong Sun Kim, Seongnam-si (KR)

(73) Assignee: KOREA ELECTRONICS TECHNOLOGY INSTITUTE, Seongnam-si, Gyeonggi-do (KR)

( * ) Notice: Subject to any disclaimer, the term of this patent is extended or adjusted under 35 U.S.C. 154(b) by 192 days.

(21) Appl. No.: 15/702,539

(22) Filed: Sep. 12, 2017

(65) Prior Publication Data

US 2018/0180650 A1 Jun. 28, 2018

(30) Foreign Application Priority Data

Dec. 23, 2016 (KR) .......................... 10-2016-0177486

(51) Int. Cl.
  *G01R 15/20* (2006.01)
  *G01R 33/00* (2006.01)
  *G01R 33/07* (2006.01)

(52) U.S. Cl.
  CPC ......... *G01R 15/205* (2013.01); *G01R 15/202* (2013.01); *G01R 33/0029* (2013.01); *G01R 33/07* (2013.01)

(58) Field of Classification Search
  CPC ............... G01R 15/205; G01R 15/202; G01R 33/0029; G01R 33/07

(Continued)

(56) References Cited

U.S. PATENT DOCUMENTS

2007/0090825 A1* 4/2007 Shoji .................... G01R 15/205
                                                      324/117 R
2008/0316655 A1* 12/2008 Shoji ..................... B82Y 25/00
                                                      360/324.1

FOREIGN PATENT DOCUMENTS

JP      2008-028412 A    2/2008
JP      2012-098202 A    5/2012

OTHER PUBLICATIONS

Office Action received in Korean Patent Application No. 10-2016-0177486, dated Feb. 20, 2018.

* cited by examiner

*Primary Examiner* — Melissa J Koval
*Assistant Examiner* — Trung Nguyen
(74) *Attorney, Agent, or Firm* — Knobbe Martens Olson & Bear LLP

(57) ABSTRACT

A measurement method and apparatus for correcting a disturbance and an offset of a sensor simultaneously are described. The method includes applying a bias current to first and second sensors of a Wheatstone bridge type connected with each other as a differential structure, and measuring a voltage of the first sensor and a voltage of the second sensor. The method also includes applying a bias current to the first and second sensors in a direction opposite to the direction in the first applying, and measuring a voltage of the first sensor and a voltage of the second sensor. The method further includes calculating a final measurement value based on the measured voltages. Accordingly, the offset and the influence of the disturbance of the sensor can be simultaneously removed through one circuit, such that advantageous effects such as reduced complexity, reduced area/volume, and shortened correction time can be achieved.

9 Claims, 10 Drawing Sheets

(58) Field of Classification Search
USPC .......... 324/200, 300, 301, 319, 205, 207.21,
324/210–219, 228, 232, 244–263, 500,
324/529, 750.12, 750.21, 754.17, 754.29;
438/848, 220, 810–829
See application file for complete search history.

MEASUREMENT METHOD AND APPARATUS FOR SIMULTANEOUS CORRECTION OF DISTURBANCE AND OFFSET OF SENSOR

CROSS-REFERENCE TO RELATED APPLICATION(S) AND CLAIM OF PRIORITY

The present application claims priority to and the benefit under 35 U.S.C. § 119(a) to Korean patent application filed in the Korean Intellectual Property Office on Dec. 23, 2016, and assigned Serial No. 10-2016-0177486, the entire disclosure of which is hereby incorporated by reference.

TECHNICAL FIELD

The present disclosure relates generally to sensor correction technology, and more particularly, to a method and an apparatus for correction for a sensor, which can remove a disturbance and an offset in a sensor like a magnetic sensor, a current sensor, or the like.

BACKGROUND

Current sensors which measure a flow of a current are divided according to current measurement methods, i.e., a direct measurement method which has a resistance arranged at a point where a current flows, and measures a current value through a voltage, and an indirect measurement method which measures a current value through a magnetic field generated by a flow of a current.

Due to power consumption by a resistance and interference in the flow of a current, the indirect measurement method is preferred to the direct measurement method.

However, in the case of the indirect measurement method, a magnetic field generated by a disturbance is included in addition to a magnetic field generated by a current to be measured as shown in FIG. 1.

Accordingly, to prevent the magnetic field generated by the disturbance, a magnetic field shielding film may be installed in a current sensor. However, this becomes a factor that increases both the volume and the price of a current sensor module.

In addition to the disturbance, there is an offset as a factor causing an error in the current sensor. The offset of a sensor is generated due to non-uniformity in a sensor fabrication process, and may correspond to a voltage value outputted in the absence of a sensor input. The concept of the offset is illustrated in FIG. 2.

A current sensor using the indirect measurement method may use a magneto resistance (MR) effect that a resistance value is changed according to a size of a magnetic field. An MR sensor is a sensor which has an electric resistance changed according to a magnetic field, and includes an anisotropic magneto resistance (AMR) sensor, a giant magneto resistance (GMR) sensor, a tunnel magneto resistance (TMR) sensor, an extraordinary magneto resistance (EMR), a planar hall resistance (PHR) sensor, or the like.

FIG. 3 illustrates a PHR sensor of a ring shape which is a kind of an MR sensor, and an electric equivalent circuit.

The PHR sensor of the ring type uses a principle that a resistance value (R1, R2, R3, and R4) changes according to directions of a bias current and an external magnetic field. As shown in FIG. 4, the bias current I and the external magnetic field B have opposite directions at R1 and R3 and have the same directions at R2 and R4. Accordingly, when the resistance values of R1 and R3 increase, the resistance values of R2 and R4 decrease.

As described above, in a current sensor of a Wheatstone bridge type like the PHR sensor, diagonally opposite resistances change in the same direction as each other. When R1×R3=R2×R4, the output voltage of the Wheatstone bridge type sensor is 0V and an offset does not occur. That is, the offset disappears when the products of opposite resistances are equal to each other.

However, in practice, it is impossible to fabricate a PHR sensor to satisfy equation R1×R3=R2×R4, and thus the PHR sensor unavoidably suffers from an offset. Accordingly, a voltage is outputted from output nodes (2 and 4) of the PHR sensor when the bias current I is applied although there is no magnetic field generated by an external current.

As described above, a disturbance and an offset are the factors that cause an error in a sensor, and various technologies are suggested to remove these factors. However, most of the technologies remove only one of the disturbance and the offset.

Accordingly, there are disadvantages that two types of correction circuits, i.e., a disturbance correction circuit and an offset correction circuit, are required, and thus complexity increases, an area/volume increases, and much time is required to correct.

SUMMARY

To address the above-discussed deficiencies of the prior art, it is a primary aspect of the present disclosure to provide a method and an apparatus for correction for a sensor, which can easily and rapidly remove influence by an offset of a sensor and a disturbance, simultaneously.

According to one aspect of the present disclosure, a measurement method of a measurement apparatus including a first sensor and a second sensor of a Wheatstone bridge type connected with each other as a differential structure includes: a first applying step of applying a bias current to the first sensor and the second sensor; a first measurement step of measuring a voltage of the first sensor and a voltage of the second sensor; a second applying step of applying a bias current to the first sensor and the second sensor in a direction opposite to the direction in the first applying step; a second measurement step of measuring a voltage of the first sensor and a voltage of the second sensor; and a step of calculating a final measurement value based on the voltages measured in the first measurement step and the voltages measured in the second measurement step.

The final measurement value may be a measurement value with an influence of a disturbance and an offset on the first sensor and the second sensor being removed.

The final measurement value may be (V1−V2−V3+V4)/4, where V1 is a voltage of the first sensor measured in the first measurement step, V2 is a voltage of the second sensor measured in the first measurement step, V3 is a voltage of the first sensor measured in the second measurement step, and V4 is a voltage of the second sensor measured in the second measurement step.

The first applying step, the first measurement step, the second applying step, and the second measurement step may be performed in a state in which a current to be measured through the first sensor and the second sensor flows through a current path.

In addition, the final measurement value may be a size of a magnetic field and a size of a current.

According to another aspect of the present disclosure, a measurement apparatus includes: a first sensor of a Wheatstone bridge type; a second sensor of a Wheatstone bridge type connected with the first sensor as a differential structure; a current generator configured to apply a bias current to the first sensor and the second sensor; a first measurement unit configured to measure a voltage of the first sensor; a second measurement unit configured to measure voltage of the second sensor; and a calculator configured to calculate a final measurement value based on voltages which are measured by the first measurement unit and the second measurement unit when a bias current is applied to the first sensor and the second sensor, and voltages which are measured by the first measurement unit and the second measurement unit when a bias current of the opposite direction is applied to the first sensor and the second sensor.

According to another aspect of the present disclosure, a measurement method of a measurement apparatus including a first sensor and a second sensor of a Wheatstone bridge type connected with each other as a differential structure includes: a first measurement step of measuring a voltage of the first sensor and a voltage of the second sensor in a state in which a current to be measured through the first sensor and the second sensor flows through a current path; a second measurement step of measuring a voltage of the first sensor and a voltage of the second sensor in a state in which a current flows through the current path in a direction opposite to the direction of the flow in the first measurement step; and a step of calculating a final measurement value based on the voltages measured in the first measurement step and voltages measured in the second measurement step.

According to another aspect of the present disclosure, a measurement apparatus includes: a first sensor of a Wheatstone bridge type; a second sensor of a Wheatstone bridge type connected with the first sensor as a differential structure; a first measurement unit configured to measure a voltage of the first sensor; a second measurement unit configured to measure a voltage of the second sensor; and a calculator configured to calculate a final measurement value based on voltages which are measured by the first measurement unit and the second measurement unit in a state in which a current to be measured through the first sensor and the second sensor flows through a current path, and voltages which are measured by the first measurement unit and the second measurement unit in a state in which a current flows through the current path in the opposite direction.

According to exemplary embodiments of the present disclosure described above, the influence of the offset and the disturbance of the sensor can be simultaneously removed through one circuit, such that advantageous effects such as reduced complexity, reduced area/volume, and shortened correction time can be achieved.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Hereinafter, the present disclosure will be described in detail with reference to the accompanying drawings.

An MR sensor which is usable as a magnetic sensor and a current sensor may be configured as a Wheatstone bridge type sensor, in which resistance components are changed according to a correlation between a direction of a bias current and a direction of an applied magnetic field, and four resistances are used to convert changes in the resistance components into output voltages.

A PHR sensor Which is a kind of an MR sensor is a magnetic sensor of a thin film shape using a hall effect, and the PHR current sensor has current paths arranged at the upper/lower ends and the outside thereof, and indirectly measures a current value by measuring a size of a magnetic field which is generated when a current flows through the current paths. Magnetic fields other than the magnetic fields generated in the current paths all become disturbances.

Figure 1:
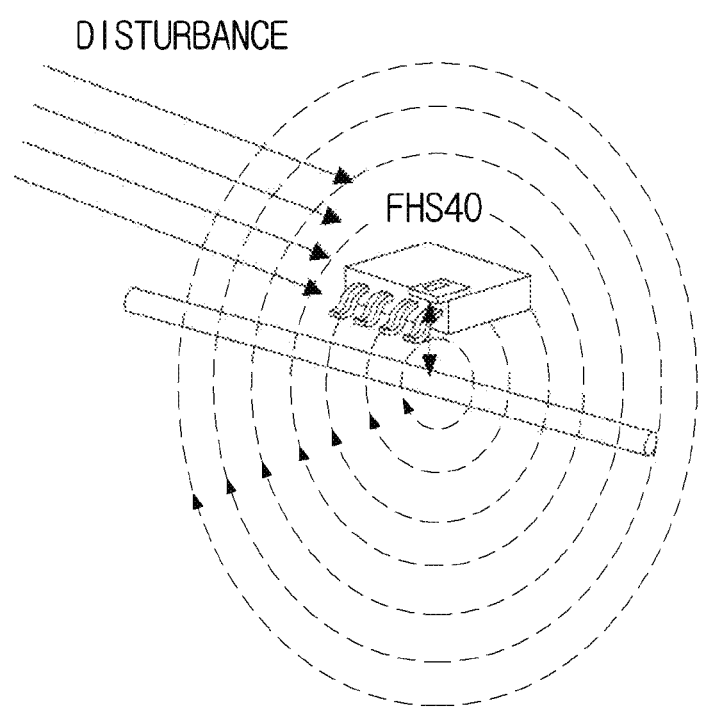
FIG. 1 is a view provided to explain a disturbance in a current sensor of an indirect measurement method.
Figure 2:
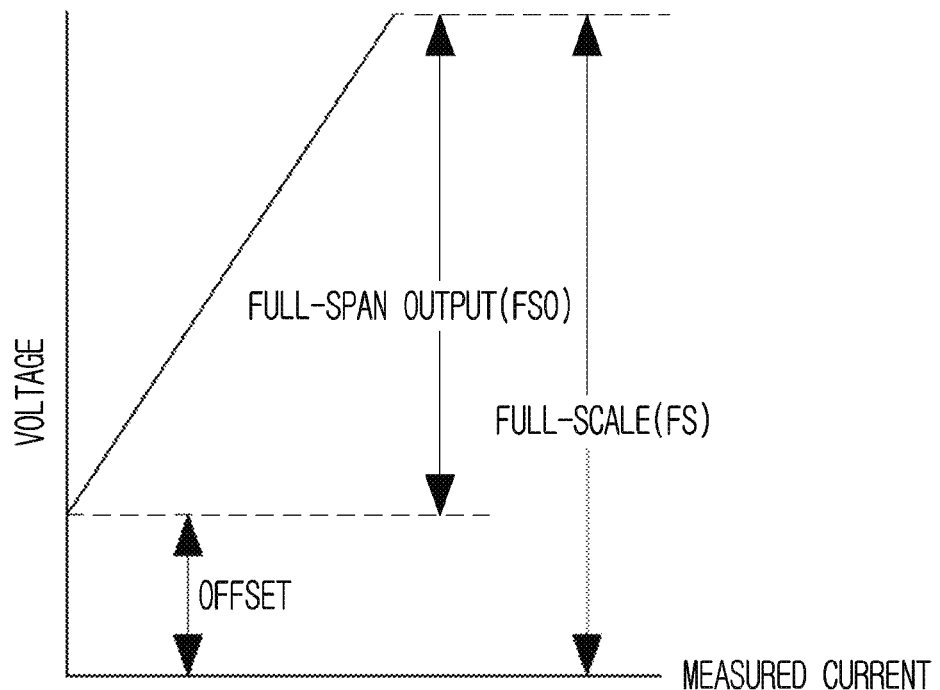
FIG. 2 is a view provided to explain an offset of a sensor.
Figure 3:
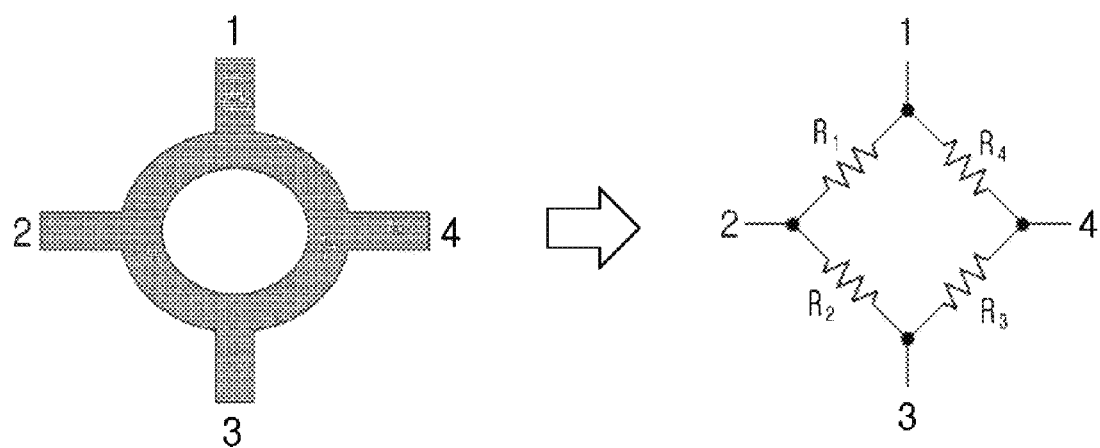
FIG. 3 is a view showing an exterior of a Wheatstone bridge type PHR sensor of a ring shape and an equivalent circuit.
Figure 4:
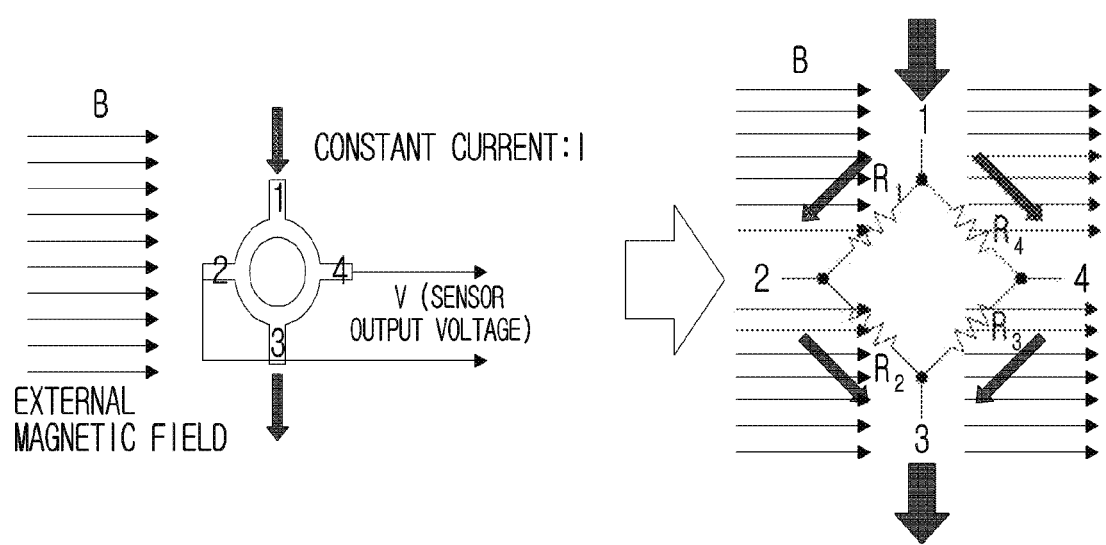
FIG. 4 is a view showing an operation principle of a PHR sensor of a ring type.
Figure 5:
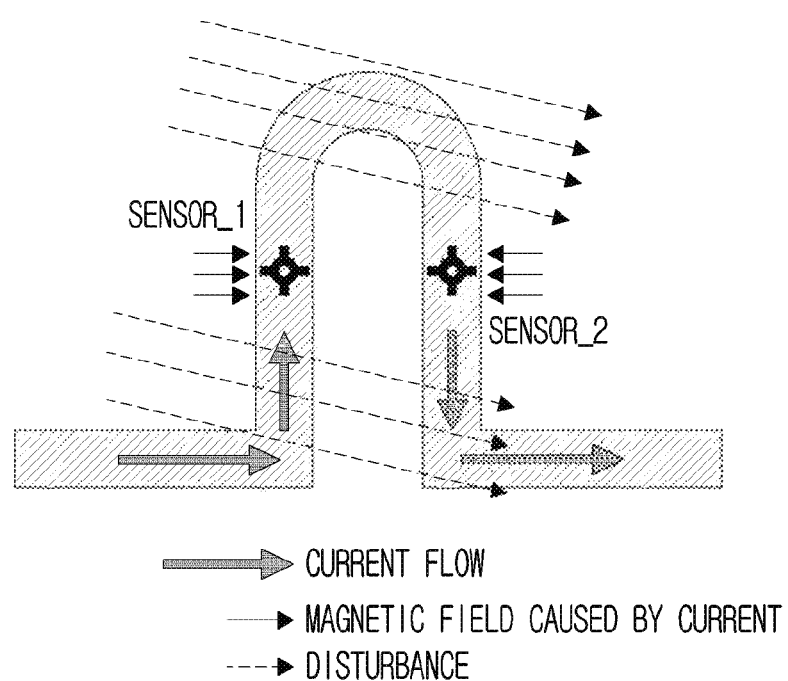
FIG. 5 is a view showing a current sensor of a differential structure for removing a disturbance.

FIG. 5 illustrates a current sensor of a differential structure. The differential method using two current sensors makes a current flow in the form of an inverted U-shape and thus makes directions of magnetic components flowing into the respective sensors opposite to each other, such that output voltages of the sensors are opposite to each other.

Figure 6:
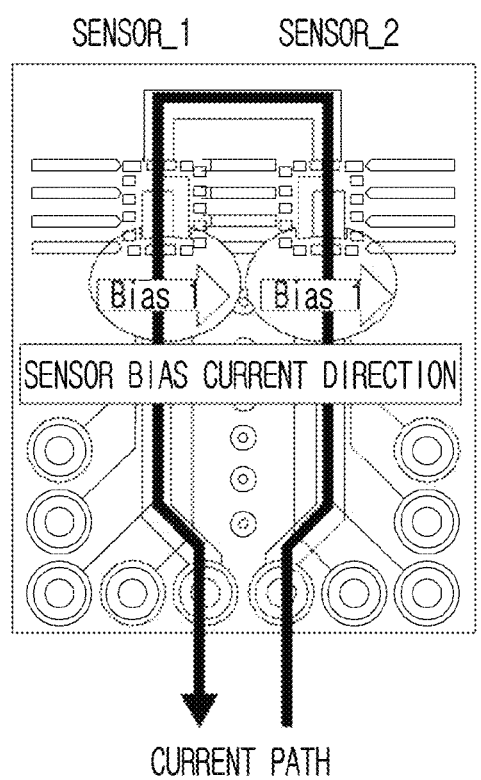
FIG. 6 is a view showing an image of a really fabricated current sensor of a differential structure.

When a disturbance comes in this structure, the two sensors which are adjacent to each other may be under the same influence and the same voltage change is caused in the outputs. Therefore, the disturbance may be removed by subtracting the outputs of the two sensors. FIG. 6 is an image of a current sensor of a differential structure for removing a disturbance.

The current sensor of the differential structure/method described above is effective only on the assumption that there is no offset between the sensors. However, there may be a difference in the offset between the two sensors used in the differential structure/method, and in some cases, the difference may be very great. In this case, the offset should be corrected.

In FIGS. 5 and 6, the current sensor positioned on the left is referred to as sensor_1 and the current sensor positioned on the right is referred to as sensor_2. When a current flows into the inverted U-shaped current path, a magnetic field is induced around the current flow in the counter clockwise direction according to Ampere's law. The induced magnetic field is inputted to the sensor_1 and the sensor_2 and changes a resistance value according to a relationship with a bias current. The changed resistance value appears as an output voltage through the Wheatstone bridge type structure.

Figure 7:
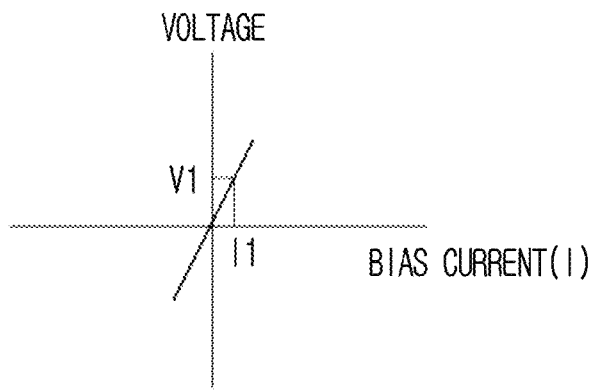
FIG. 7 is a view showing an output of a current sensor of a differential structure when there is no offset.
Figure 7:
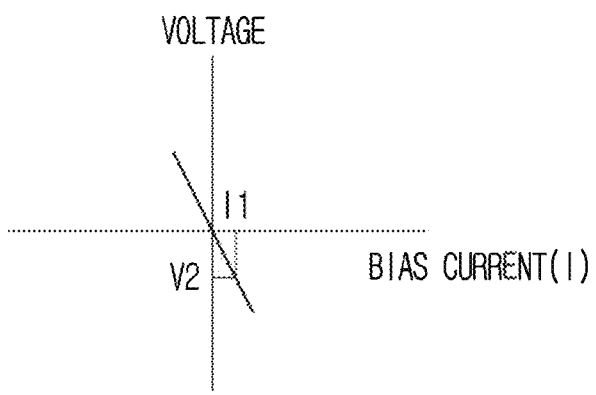

The disturbance may be removed in the following ways. It is assumed that the two sensors, sensor_1 and sensor_2, are the same without an offset and a current to be measured flows through the current paths. In this case, when a bias current I1 is applied to the two sensors, the sensor_1 outputs V1 and the sensor_2 outputs V2 as shown in FIG. 7. Since the directions of the magnetic fields applied to the sensor_1 and the sensor_2 are opposite to each other, V1 and V2 have the same size but have opposite signs (V2=−V1).

When it is assumed that the sensor_1 and the sensor_2 output more voltages by "n" due to a disturbance, the sensor_1 outputs a value V1+n and the sensor_2 outputs a value V2+n.

The output value of the sensor_2 subtracted from the output value of the sensor_1 is V1+n−V2−n, that is V1−V2. Since V2=−V1, V1−V2 equals 2V1. By multiplying this value with ½, a desired voltage V1 is obtained.

Figure 8:
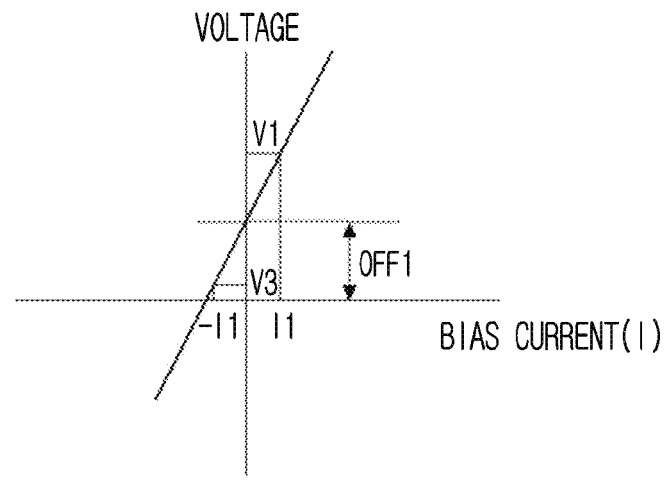
FIG. 8 is a view showing an output of a current sensor of a differential structure when there is an offset.
Figure 8:
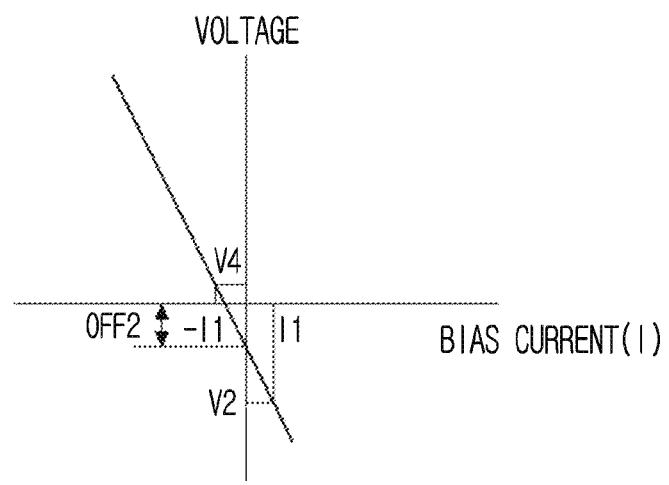

However, when the offsets of the sensor_1 and the sensor_2 connected with each other as a differential structure are different from each other, the sensor_and the sensor_2 may output voltages as shown in FIG. 8. In this case, the desired voltage value V1 may not be obtained due to the offsets.

Accordingly, the offsets of the sensor_1 and the sensor_2 should be measured and should be corrected according to a voltage difference in the sensor_1 and the sensor_2 caused by an input magnetic field. However, measuring/storing the offset values of the sensor_1 and the sensor_2 first and correcting the offset values may be a cumbersome process.

Therefore, embodiments of the present disclosure suggest a method for simultaneously removing influences of a disturbance and an offset in a current sensor of a differential structure/method.

Specifically, embodiments of the present disclosure suggest a method of removing a disturbance and an offset simultaneously simply by measuring a voltage according to a change in the flow of a bias current, rather than a method of removing by measuring respective offsets of sensor_1 and sensor_2 connected with each other as a differential structure.

When a bias current I1 is applied, the sensor_1 outputs a voltage value "V1+n." On the assumption that the offset value of the sensor_1 is off1, a finally desired output value is "V1−off1" with the disturbance and the offset being removed.

On the assumption that the offset values of the sensor_1 and the sensor_2 are off1 and off2, respectively, a final output value may be calculated as {(V1+n)−(V2+n)}/2= (V1−V2)/2 according to the above-suggested method. However, since off1≠off2, V2≠−V1.

When a noise "n" is inputted in addition to a magnetic field caused by an external current to be measured, output values of the sensor_1 and the sensor_2 are V1+n and V2+n, respectively. These two output values include the offset values of the sensor_1 and the sensor_2, off1 and off2, respectively.

The desired final output value may be calculated by the following equation based on the output values of the sensor_1 and the sensor_2:

$$\{(V1+n-\text{off1})-(V2+n-\text{off2})\}/2=\{(V1-\text{off1})-(V2-\text{off2})\}/2=\{V1-V2-\text{off1}+\text{off2}\}/2 \quad \text{Equation (1)}$$

When a bias current −I1 is applied to the sensor_1 and the sensor_2, the sensor_1 and the sensor_2 output V3+n and V4+n respectively. The offset values of the sensor_1 and the sensor_2 may be expressed by equations off1=(V1+V3)/2 and off2=(V2+V4)/2, respectively (see FIG. 8).

When these equations are substituted for equation (1), the following equation is obtained:

$$\{V1-V2-(V1+V3)/2+(V2+V4)/2\}/2=(V1-V2-V3+V4)/4 \quad \text{Equation (2)}$$

Accordingly, a final measurement value in which both the disturbance and the offset are corrected simultaneously is calculated by the above-described equation (2) which expresses V1, V2, V3, and V4 voltages with addition and subtraction.

Figure 9:
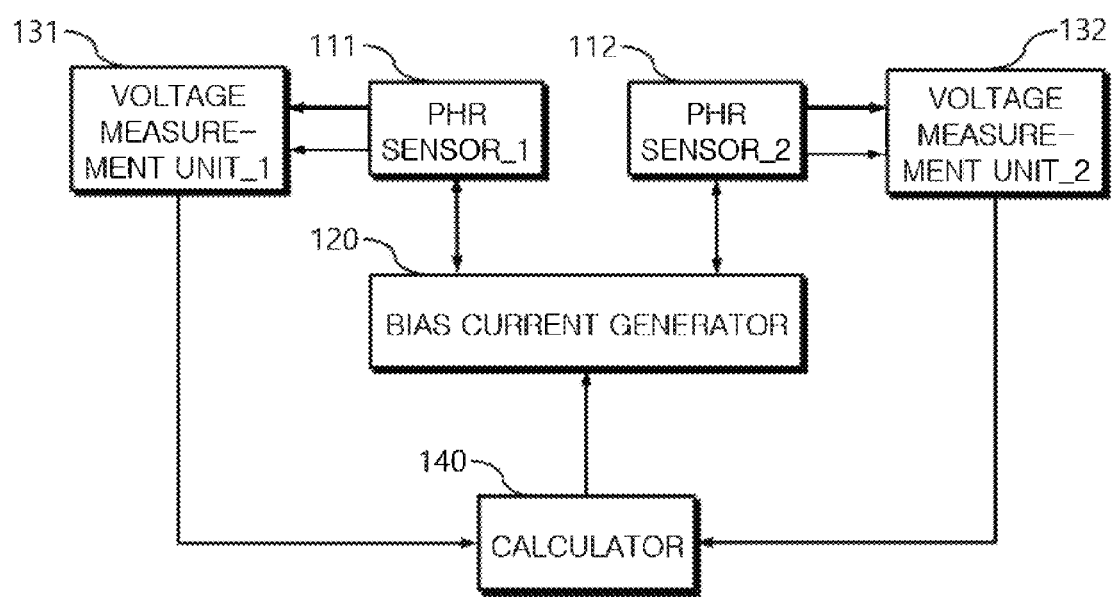
FIG. 9 is a block diagram of a current measurement apparatus according to an exemplary embodiment of the present disclosure.

A current measurement apparatus, which is designed based on the above-described explanation and can simultaneously correct both a disturbance and an offset, will be described in detail with reference to FIG. 9. FIG. 9 is a block diagram of a current measurement apparatus according to an exemplary embodiment of the present disclosure.

As shown in FIG. 9, the current measurement apparatus according to an exemplary embodiment of the present disclosure includes a PHR sensor_1 111, a PHR sensor_2 112, a bias current generator 120, a voltage measurement unit_1 131, a voltage measurement unit_2 132, and a calculator 140.

The bias current generator 120 is a power supply device which generates a bias current and supplies the bias current to the PHR sensor_1 111 and the PHR sensor_2 112. A direction of the bias current (current flow) generated by the bias current generator 120 is controlled by the calculator 140.

The voltage measurement unit_1 131 measures a voltage value of the PHR sensor_1 111, and the voltage measurement unit_2 132 measures a voltage value of the PHR sensor_2 112.

The calculator 140 controls the bias current generator 120 and calculates a final measurement value by correcting both a disturbance and an offset using the voltage values measured by the voltage measurement unit_1 131 and the voltage measurement unit_2 132.

A process of correcting a disturbance and an offset simultaneously in measuring a current at the current measurement apparatus shown in FIG. 9 will be described in detail with reference to FIG. 10.

Figure 10:
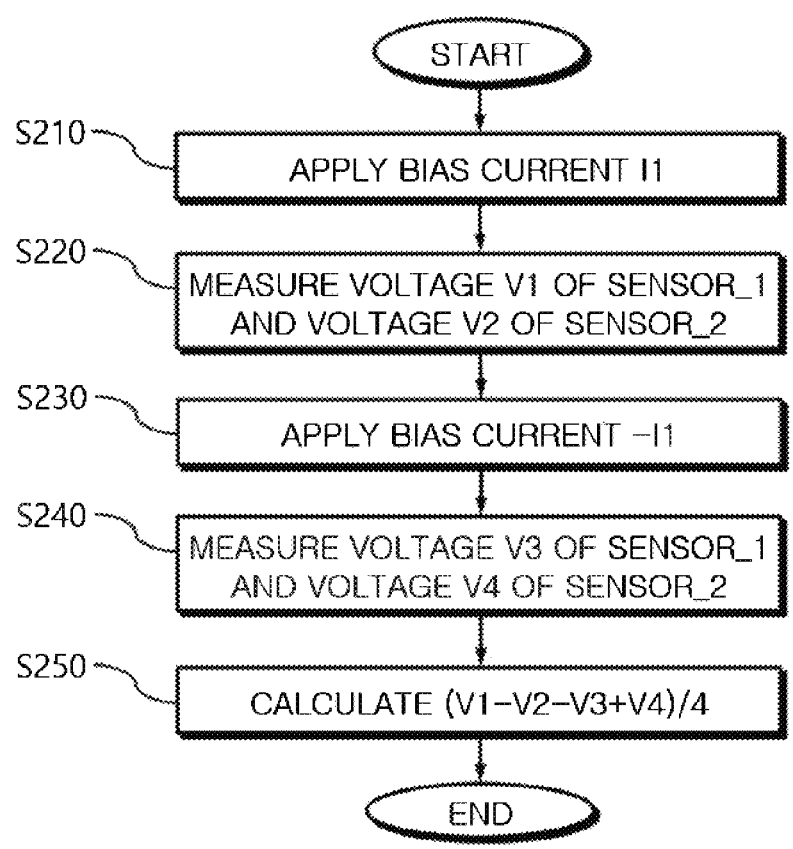
FIG. 10 is a flowchart provided to explain a process of calculating a correction value in the current measurement apparatus shown in FIG. 9, and correcting a current value using the correction value.

As shown in FIG. 10, when a current to be measured flows through current paths, the bias current generator 120 generates and applies a bias current I1 under the control of the calculator 140 (S210).

Then, the voltage measurement unit_1 131 and the measurement unit_2 132 measure a voltage V1 of the PHR sensor_1 111 and a voltage V2 of the PHR sensor_2 112, respectively (S220).

Next, the bias current generator 120 generates and applies a bias current −I1 under the control of the calculator 140 (S230). The bias current −I1 generated and applied in step S230 has the same size as that of the bias current I1 generated and applied in step S210, but has the opposite direction.

The voltage measurement unit_1 131 and the voltage measurement unit_2 132 measure a voltage V3 of the PHR sensor_1 111 and a voltage V4 of the PHR sensor_2 112 (S240), respectively (S240).

The calculator 140 calculates (V1−V2−V3+V4) using the voltage values measured in step S220 and S240 (S250).

The voltage value calculated in step S250 corresponds to a final measurement value indicating the size of the current to be measured, which flows through the current paths.

Up to now, the current measurement method and apparatus which can simultaneously correct the disturbance and the offset of the PHR sensor have been described with reference to preferred embodiments.

In the above-described embodiments, a value in which a disturbance and an offset are corrected simultaneously is calculated using four voltage values which are measured while changing the direction of a bias current. However, a value in which a disturbance and an offset are corrected simultaneously may be calculated using four voltage values which are measured while changing the direction of a current to be measured, which flows through current paths, rather than the bias current.

Specifically, the same result may be obtained even when the right-hand side of equation (2) is substituted with voltage values V1 and V2, which are measured at the sensor_1 and the sensor_2 after a current to be measured is applied to a current path formed in the form of an inverted U-shape in the clockwise direction, and voltage values V3 and V4, which are measured at the sensor_1 and the sensor_2 after the current is applied in the counter clockwise direction with the fixed bias current I1.

In addition, the PHR sensor mentioned in the above-described embodiments is a kind of a magnetic sensor or a current sensor having a Wheatstone bridge type and is merely an example. The technical idea of the present disclosure can be applied to other types of sensors having the Wheatstone bridge type.

The technical idea of the present disclosure may be applied to a computer-readable recording medium which has a computer program recorded thereon, for performing the functions of the apparatus and the method according to the present embodiments. In addition, the technical idea according to various embodiments of the present disclosure may be implemented in the form of a computer-readable code recorded on a computer-readable recording medium. The computer-readable recording medium may be any data storage device that can be read by a computer and can store data. For example, the computer-readable recording medium may include a ROM, a RAM, a CD-ROM, a magnetic tape, a floppy disk, an optical disk, a hard disk drive, or the like. In addition, a computer-readable code or program stored in the computer-readable recording medium may be transmitted through a network connected between computers.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A measurement method using a measurement apparatus comprising a first sensor and a second sensor of a Wheatstone bridge type connected with each other as a differential structure, the measurement method comprising:

first applying a bias current, in a first direction, to the first sensor and the second sensor;

first measuring a voltage of the first sensor and a voltage of the second sensor;

second applying a bias current to the first sensor and the second sensor in a second direction opposite to the first direction;

second measuring a voltage of the first sensor and a voltage of the second sensor; and calculating a final measurement value based on the voltages measured in the first measuring and the voltages measured in the second measuring, wherein the final measurement value is (V1−V2−V3+V4)/4, where V1 is a voltage of the first sensor measured in the first measuring, V2 is a voltage of the second sensor measured in the first measuring, V3 is a voltage of the first sensor measured in the second measuring, and V4 is a voltage of the second sensor measured in the second measuring.

2. The measurement method of claim 1, wherein the first applying, the first measuring, the second applying, and the second measuring are performed in a state in which a current to be measured through the first sensor and the second sensor flows through a current path.

3. The measurement method of claim 1, wherein the final measurement value is a size of a magnetic field and a size of a current.

4. A measurement apparatus comprising:

a first sensor of a Wheatstone bridge type;

a second sensor of a Wheatstone bridge type connected with the first sensor as a differential structure;

a current generator configured to apply a bias current to the first sensor and the second sensor;

a first measurement unit configured to measure a voltage of the first sensor;

a second measurement unit configured to measure a voltage of the second sensor; and a calculator configured to calculate a final measurement value based on voltages measured by the first measurement unit and the second measurement unit when a bias current is applied, in a first direction, to the first sensor and the second sensor, and voltages measured by the first measurement unit and the second measurement unit when a bias current is applied to the first sensor and the second sensor in a second direction opposite to the first direction, wherein the final measurement value is (V1−V2−V3+V4)/4, where V1 is a voltage of the first sensor which is measured by the first measurement unit when a bias current is applied to the first sensor and the second sensor, V2 is a voltage of the second sensor which is measured by the second measurement unit when a bias current is applied to the first sensor and the second sensor, V3 is a voltage of the first sensor which is measured by the first measurement unit when a bias current of an opposite direction is applied to the first sensor and the second sensor, and V4 is a voltage of the second sensor which is measured by the second measurement unit when a bias current of the opposite direction is applied to the first sensor and the second sensor.

5. A measurement method using a measurement apparatus comprising a first sensor and a second sensor of a Wheatstone bridge type connected with each other as a differential structure, the measurement method comprising:
first measuring a voltage of the first sensor and a voltage of the second sensor in a state in which a current to be measured through the first sensor and the second sensor flows through a current path in a first direction;
second measuring a voltage of the first sensor and a voltage of the second sensor in a state in which a current flows through the current path in a second direction opposite to the first direction; and
calculating a final measurement value based on the voltages measured in the first measuring and voltages measured in the second measuring,
wherein the final measurement value is $(V1-V2-V3+V4)/4$,
where $V1$ is a voltage of the first sensor measured in the first measuring, $V2$ is a voltage of the second sensor measured in the first measuring, $V3$ is a voltage of the first sensor measured in the second measuring, and $V4$ is a voltage of the second sensor measured in the second measuring.

6. A The measurement apparatus comprising:
a first sensor of a Wheatstone bridge type;
a second sensor of a Wheatstone bridge type connected with the first sensor as a differential structure;
a first measurement unit configured to measure a voltage of the first sensor;
a second measurement unit configured to measure a voltage of the second sensor; and
a calculator configured to calculate a final measurement value based on voltages measured by the first measurement unit and the second measurement unit in a state in which a current to be measured through the first sensor and the second sensor flows through a current path in a first direction, and voltages measured by the first measurement unit and the second measurement unit in a state in which a current flows through the current path in a second direction opposite to the first direction,
wherein the final measurement value is $(V1-V2-V3+V4)/4$,
where $V1$ is a voltage of the first sensor which is measured by the first measurement unit in a state in which a current to be measured through the first sensor and the second sensor flows in the current path, $V2$ is a voltage of the second sensor which is measured by the second measurement unit in a state in which a current to be measured through the first sensor and the second sensor flows through the current path, $V3$ is a voltage of the first sensor which is measured by the first measurement unit in a state in which a current flows through the current path in an opposite direction, and $V4$ is a voltage of the second sensor which is measured by the second measurement unit in a state in which a current flows through the current path in the opposite direction.

7. A non-transitory computer-readable recording medium which has a program stored thereon, for performing a measurement method comprising:
first applying a bias current, in a first direction, to a first sensor and a second sensor of a Wheatstone bridge type connected with each other as a differential structure;
first measuring a voltage of the first sensor and a voltage of the second sensor;
second applying a bias current to the first sensor and the second sensor in a second direction opposite to the first direction;
second measuring a voltage of the first sensor and a voltage of the second sensor; and
calculating a final measurement value based on the voltages measured in the first measuring and the voltages measured in the second measuring,
wherein the final measurement value is $(V1-V2-V3+V4)/4$,
where $V1$ is a voltage of the first sensor measured in the first measuring, $V2$ is a voltage of the second sensor measured in the first measuring, $V3$ is a voltage of the first sensor measured in the second measuring, and $V4$ is a voltage of the second sensor measured in the second measuring.

8. The measurement method of claim 1, wherein the final measurement value is a measurement value with an influence of a disturbance and an offset on the first sensor and the second sensor being removed.

9. The measurement method of claim 5, wherein the final measurement value is a measurement value with an influence of a disturbance and an offset on the first sensor and the second sensor being removed.

* * * * *